United States Patent [19]

Germer et al.

[11] Patent Number: 5,001,420
[45] Date of Patent: Mar. 19, 1991

[54] MODULAR CONSTRUCTION FOR ELECTRONIC ENERGY METER

[75] Inventors: Warren R. Germer, Dover, N.H.; Maurice J. Ouellette, North Berwick, Me.; Donald F. Bullock, Madbury; Ansell W. Palmer, Hampton, both of N.H.

[73] Assignee: General Electric Company, Somersworth, N.H.

[21] Appl. No.: 411,934

[22] Filed: Sep. 25, 1989

[51] Int. Cl.[5] .......................... G01R 1/00; G01R 22/00
[52] U.S. Cl. .................................... 324/142; 324/114; 324/156; 361/364; 361/370
[58] Field of Search ............... 324/107, 109, 141, 142, 324/156; 364/483, 492; 361/364, 370

[56] References Cited

U.S. PATENT DOCUMENTS

| | | | |
|---|---|---|---|
| 4,404,522 | 9/1983 | Pucciarello | 324/156 |
| 4,491,790 | 1/1985 | Miller | 324/142 |
| 4,615,009 | 9/1986 | Battodetti et al. | 324/141 |
| 4,744,004 | 5/1988 | Hammond | 324/156 |
| 4,758,962 | 7/1988 | Fernandes | 364/492 |
| 4,795,975 | 1/1989 | Cox | 324/156 |

OTHER PUBLICATIONS

"Digital Panel Meters/Digital Multimeters/Battery Packs", by Weston Corp., 12/70, pp. 1–22, I 324/156.

*Primary Examiner*—Reinhard J. Eisenzopf
*Assistant Examiner*—William J. Burns
*Attorney, Agent, or Firm*—Robert E. Brunson; Irving M. Freedman

[57] ABSTRACT

A modular versatile electronic energy meter is provided with current voltage and register modules which may be selected and readily interconnected along with a selected output circuit board and including a plurality of features which may be customized late in the manufacturing cycle or after manufacture, including jumpers adapted to be selectively cut and attachable switch restrictors. Reduction and standarization of components and uncomplex interconnections are provided, along with apparatus to assure proper assembly and testing of the modular meter.

66 Claims, 5 Drawing Sheets

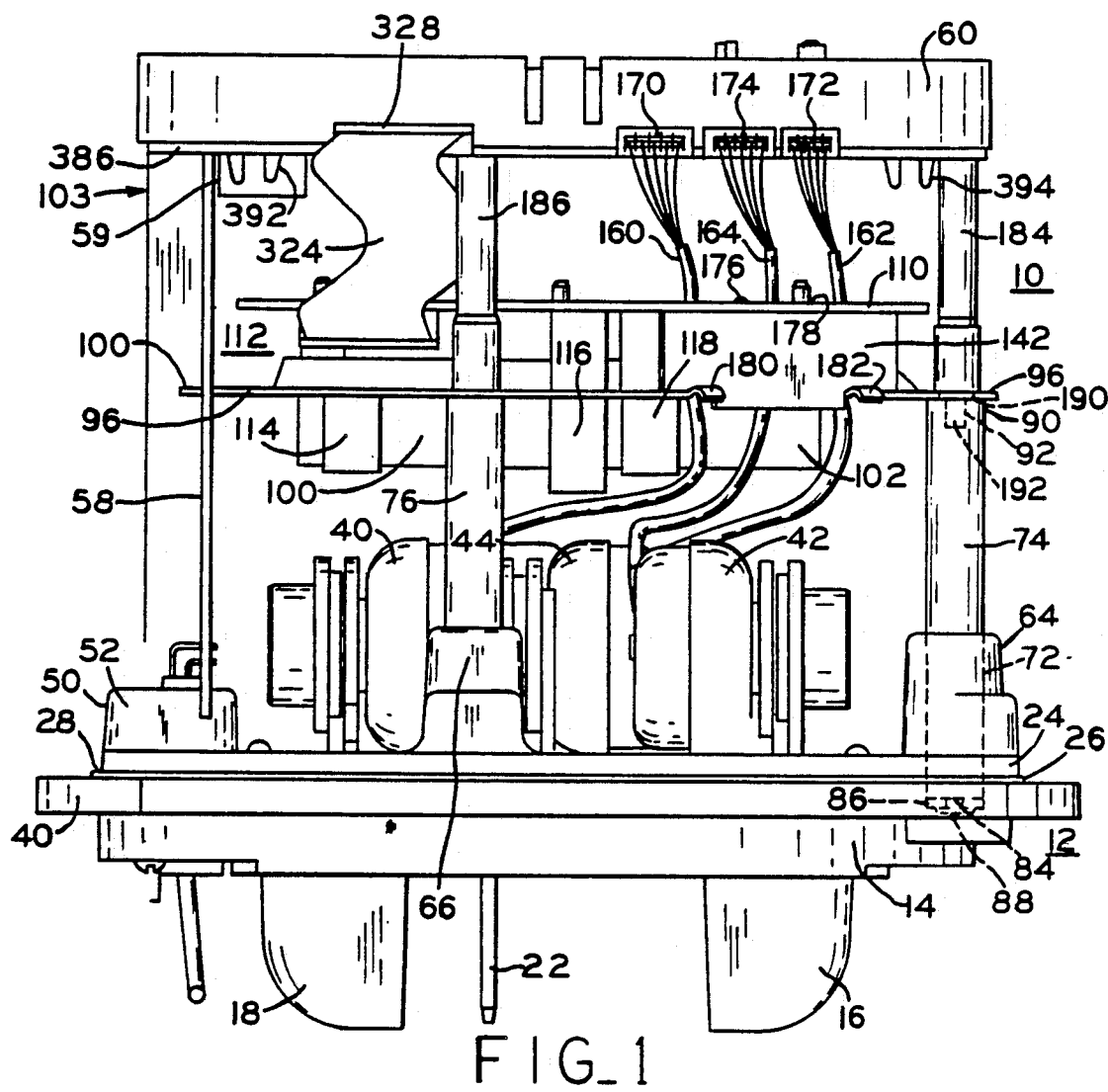
FIG_1
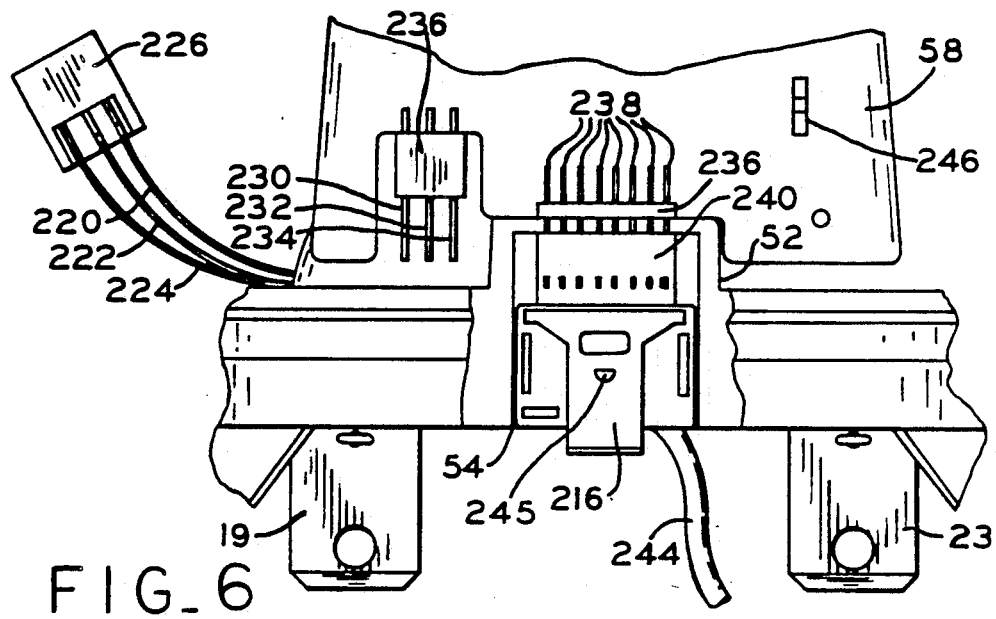
FIG_6

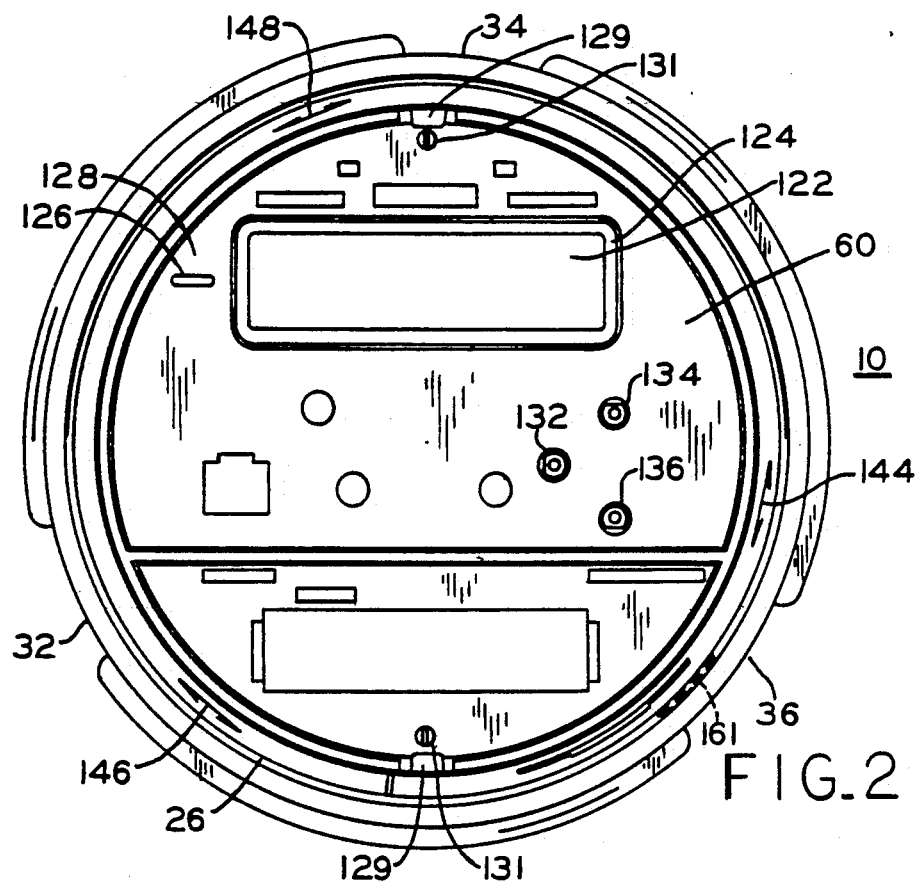
FIG_2
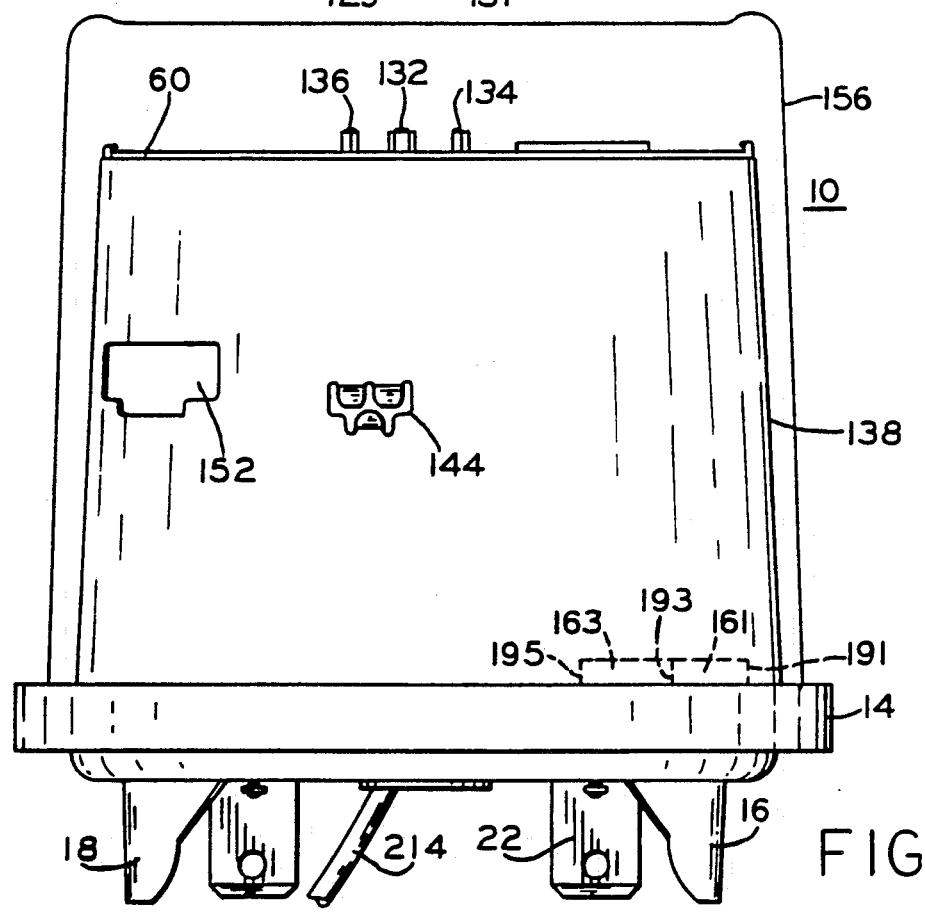
FIG_3

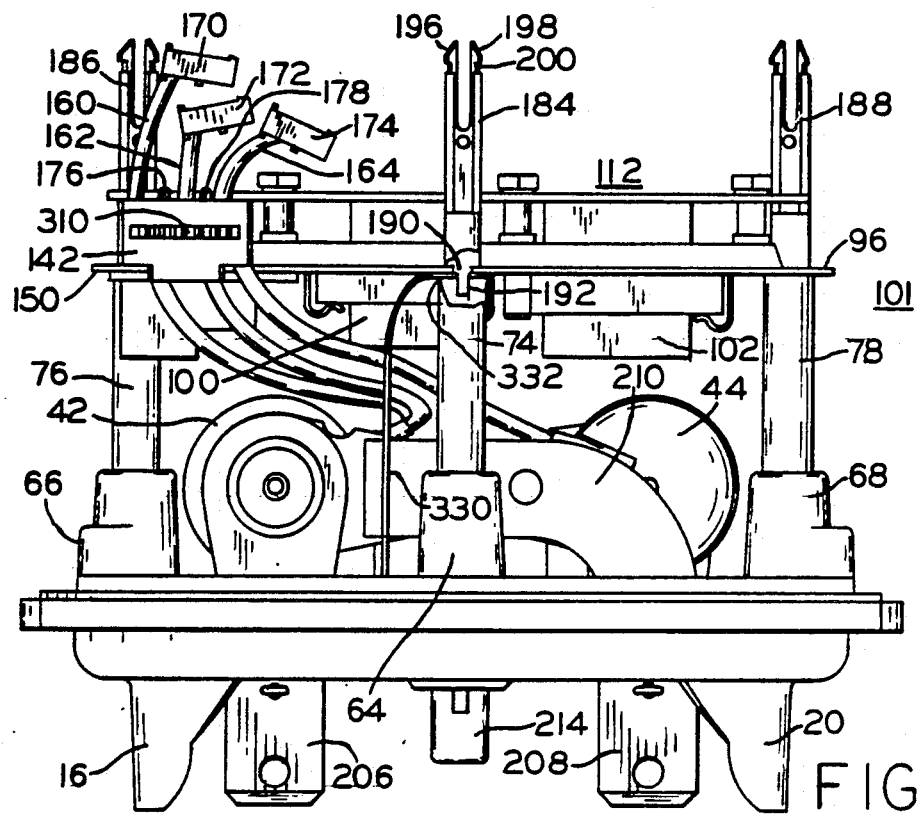
FIG_4
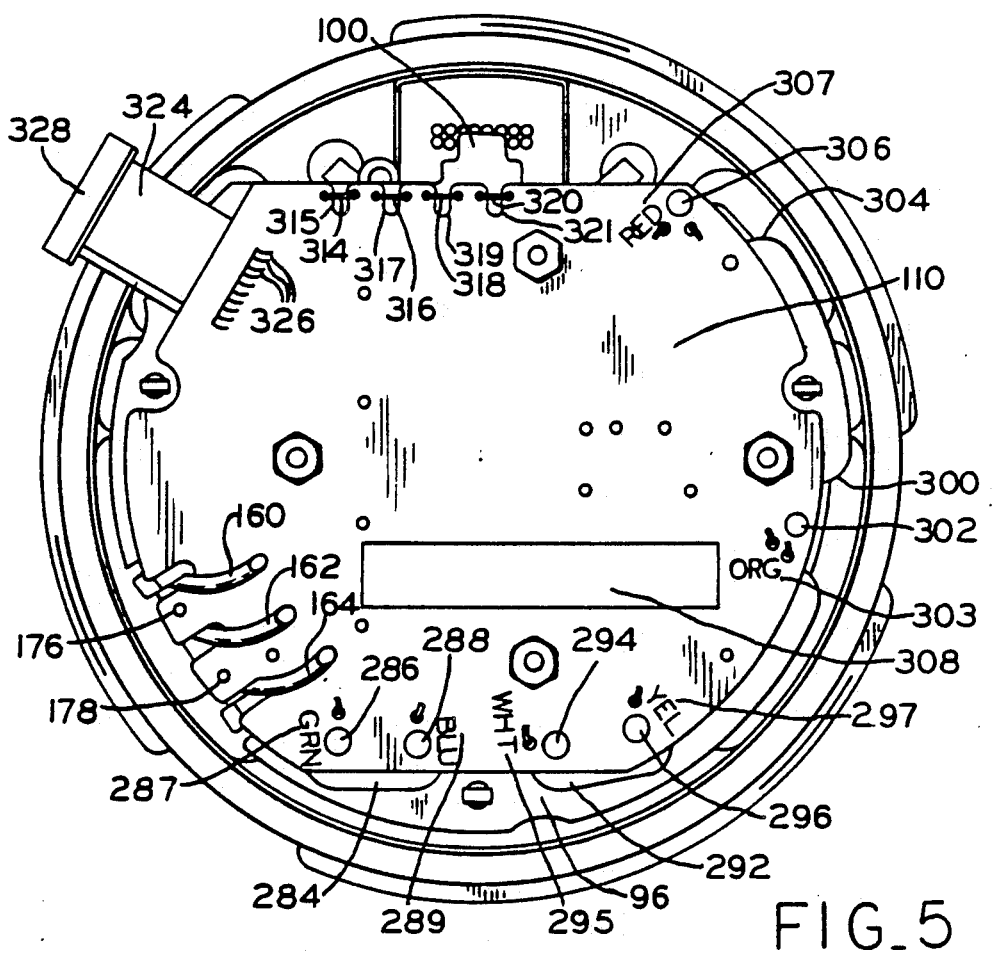
FIG_5

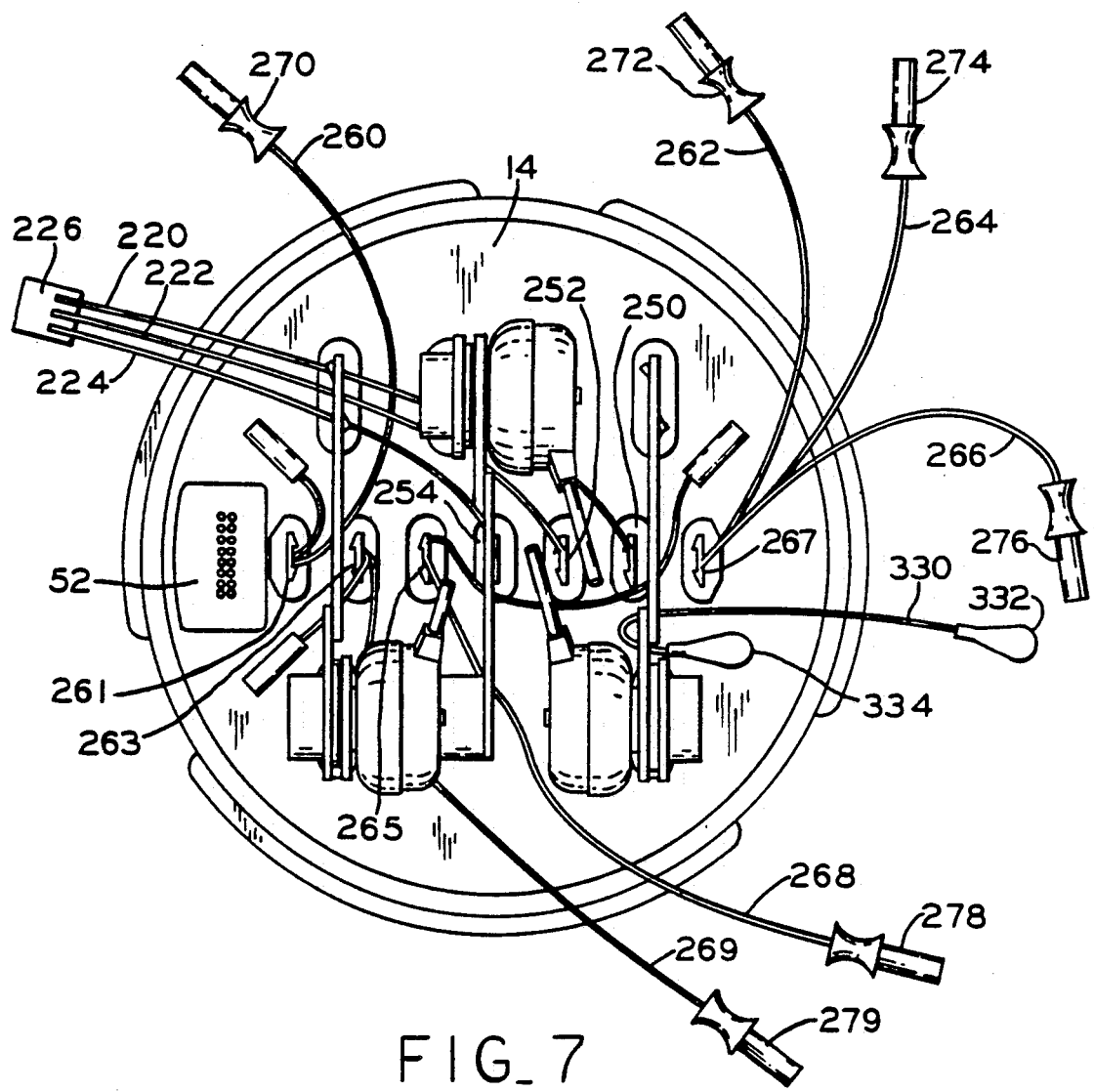
FIG_7
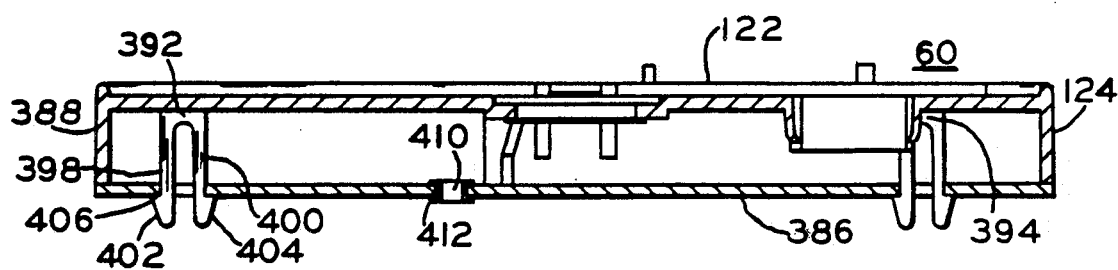
FIG_8

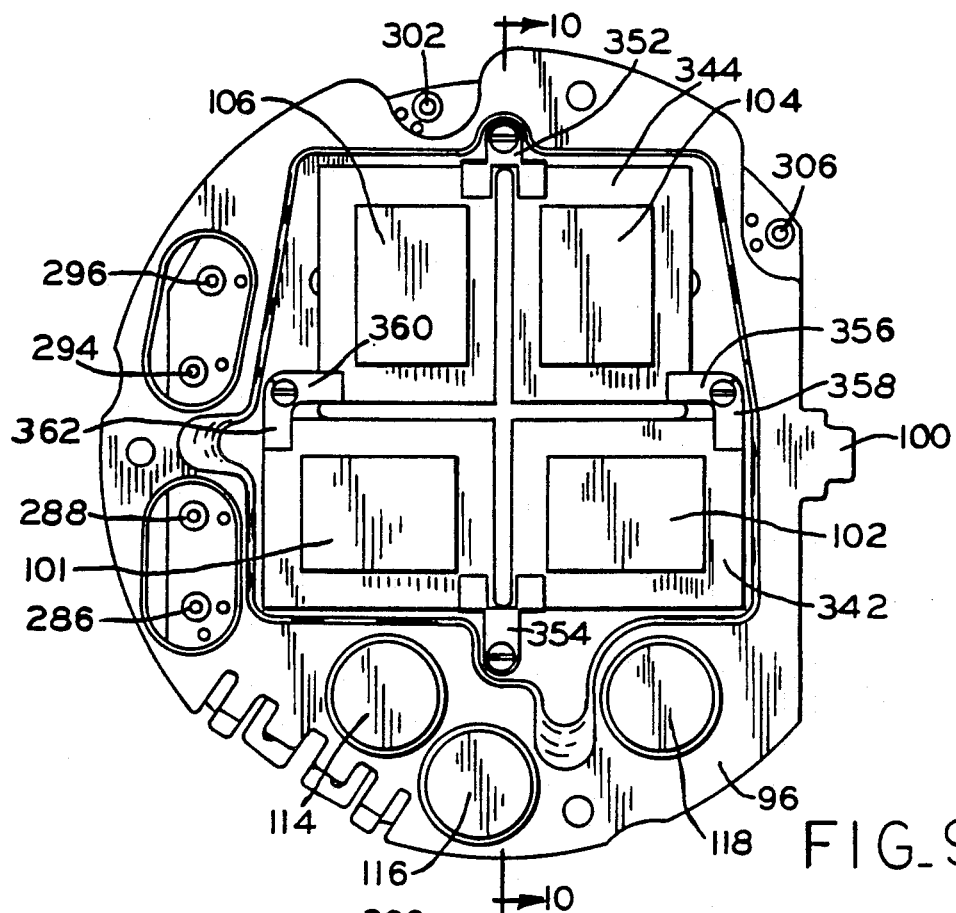
FIG_9
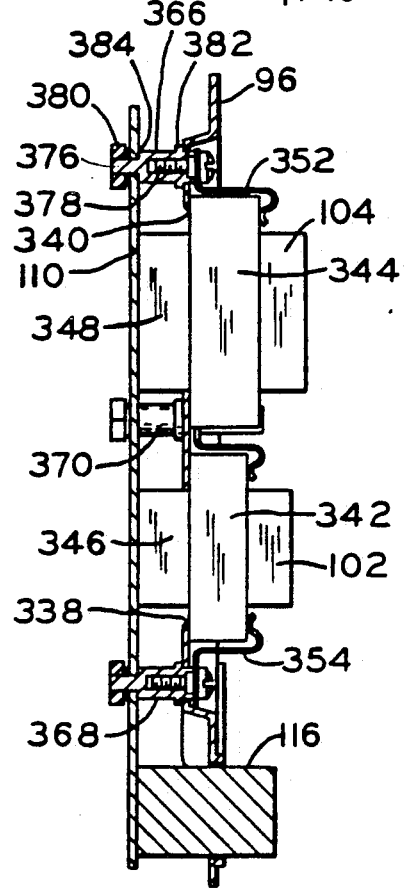
FIG_10

MODULAR CONSTRUCTION FOR ELECTRONIC ENERGY METER

BACKGROUND ON INVENTION

The present invention relates to electric energy meters, and particularly electronic electric energy meters and the construction of such meters.

With the use of electronics in electric energy meters, including microprocessors and digital signal processing, the capabilities and potential for increased features, output information, and built-in testing has been greatly expanded. It is possible to offer and meet customer requirements for a large number of optional features and functions including self-check test functions, demand metering with versatility in setting and displaying demand periods, and other functions and modes of operation. However, with such increased versatility comes greatly increased problems of manufacturing, stocking and repairing a large number of different energy meters. In addition, meters must be capable of meeting customer requirements as to voltage rating, class (or current rating), and form. The form is typically an application description according to an American National Standards Institute (ANSI) standard such as C12.10-1978.

The result is literally hundreds of potentially different meters each differing in combinations of features and attributes. This has led to considerable concern and interest in simplifying the manufacture of electric energy meters, which, would decrease the cost of manufacture and assembly, minimize the number of parts required and thus lower the cost and problems associated with stocking spare parts and providing repairs. At the same time it is necessary to provide a versatile energy meter construction which can readily be differently configured to meet a large variety of customer requirements. In order to maximize the use of mass production techniques and minimize the amount of manpower required for such customized energy meters, the need exists for improved energy meter designs and construction arrangements which meet the above objectives, while at the same time providing a basic energy meter design which may be manufactured and stocked, and subsequently readily customized to meet a large number of specific customer requirements.

OBJECTS AND SUMMARY OF INVENTION

It is an object of the present invention to provide an improved electronic energy meter which is simplified and less costly to manufacture, yet which provides increased versatility in its features and applications.

It is another object of the present invention to provide an electronic energy meter with increased interchangeability of components to provide different functions and features to meet a large number of customer specifications.

It is yet another object of the present invention to provide an electronic energy meter with optimized interchangeability of components while simplifying electrical and mechanical interconnections.

It is still another object of the present invention to provide an electric energy meter utilizing modular construction, the modules of which may be manufactured and stocked, and subsequently customized, enabling late point feature identification.

It is a further object of the present invention to provide an electronic energy meter which meets industry standards, is versatile in providing increased features and functions, and yet which is interchangeable with meters in existing installations.

It is a still further object of the present invention to provide an electronic energy meter with great versatility in features and functions, and yet which simplifies the assembly and accurate testing of the assembled meter.

In accordance with one embodiment of the present invention a flexible three module electronic power meter is provided including a base module, a voltage module, and a meter-register assembly module. Detachable mechanical and electrical connections are provided. The base module includes terminals adapted to be connected in circuit with the power source and load to be metered and comprises a family of modules including different current sensors and ratings. The voltage module family includes a planar support member parallel to the base on which one or more selected transforms are mounted providing different voltage ratings and power to the electronics. Signals provided from the current and voltage modules are normalized enabling the use of the various meter-register assembly modules with any combination of current and voltage modules.

The selected current module, the selected voltage module, and the desired meter-register assembly are detachably and readily interconnected by flexible electrical conductors and connectors, and mechanical spacers and support means.

Additional customizing is possible late in the manufacturing cycle or even subsequent thereto by an optional family of output circuit boards, to provide signal connections between the register assembly and the outside of the electronic meter, and further including VARS-Q switching means. In addition, jumpers are provided which may be cut to provide the desired normalized signals after the current and voltage modules are selected. Still further flexibility is provided by switch restrictors to enable selection of those functions accessible to the meter reader from outside the cover.

Bar coding is provided on various assemblies and other means, including color coding, are provided to ensure proper assembly and testing of the selected components and modules, providing a design which minimizes parts while maximizing flexibility and the ability to customize electronic energy meters late in the manufacturing cycle.

DRAWINGS AND BRIEF DESCRIPTION OF INVENTION

FIG. 1 is a front view of an electronic energy meter incorporating the present invention with the shield and cover removed.

FIG. 2 is a top view of FIG. 1 with the shield included.

FIG. 3 is a side view of FIG. 2 with the shield and cover included.

FIG. 4 is a rotated side view of a portion of FIG. 1.

FIG. 5 is a top view of FIG. 4.

FIG. 6 is a cutaway side view of a portion of FIG. 1 showing connections through the base.

FIG. 7 is a top view, in reduced size, of the base portion of FIG. 1.

FIG. 8 is a cross sectional side view of the meter-register assembly portion of FIG. 1.

FIG. 9 is a bottom view of the voltage module of FIG. 1.

FIG. 10 is a side view of the voltage module of FIG. 9.

Referring first to FIG. 1. FIG. 1 shows an electronic energy meter 10 including a base or current module 12. The base 14 includes 4 positioning tabs molded integral with the base, two of which, 16 and 18, are shown. A plurality of terminals such as 22 pass through the base 14 to connect the meter in circuit with a source of power and a load which is to be metered. The base 14 includes a central rim 24 surrounded by the circular step 26 with a narrow "tread" 28.

As best shown in FIG. 2, the base 14 also includes three cutouts 32, 34 and 36 equally spaced around the peripheral rim 40 for inserting tabs (not shown) in the rim of the cover 156 (see FIG. 3) to secure the cover to the base. The multiple terminals such as 22 and base 14 are configured in accordance with the industry standard ANSI C12.10, 1978 to insure interchangeability and proper fit and orientation with ANSI standard meter sockets. Notwithstanding additional functions and modes of operation provided by the electronic energy meter 10, it is important to be able to directly substitute the electronic energy meter for a less sophisticated electro-mechanical energy meter in an existing installation.

Two or three current sensors such as 40, 42 and 44, are mounted on the terminal extensions above the base 14 as better illustrated and described in connection with FIG. 4 below. The current sensors may be of the type described in U.S. Pat. application Ser. No. 259,234, now abandoned, filed Oct. 18, 1988 by D. F. Bullock, which patent application is assigned to the same assignee as the present invention, and which is hereby incorporated by reference. The specific current sensors 40, 42 and 44 are selected to provide the desired meter class according to ANSI standards such as class 20 (20 ampere current flow) and class 200 (200 ampere current flow). Separate base or current modules 12 may be manufactured and stocked to meet various meter class requirements and selectively used as building blocks in fabricating customized energy meters as described in more detail below.

As shown in FIG. 1, also molded within the base 14 is a connector cavity 50 including a raised pocket 52 above the base 14 and a re-entrant pocket cavity 54 (best shown in FIG. 6) molded within the base. Connector cavity 50 enables the optional connection of a selected output circuit board 5 positioned between the connector cavity and register module 60. The output circuit board 58 provides the flexibility of selecting appropriate signal processing and connecting circuitry to enable the interconnection of the electronics associated with register module 60 and circuitry outside the meter, through the connector cavity 50, as is described in more detail below in connection with FIG. 6, and also in U.S. Pat. application Ser. No. 07/412,351, filed 9/25/89 by W. R. Germer, J. Stillwagon and P. F. Coryea, and assigned to the same assignee as the present invention, and which is hereby incorporated by reference.

The base 14 also includes three support receptacles 64, 66, and 68; two of which, 64 and 66, are shown in FIG. 1. The support receptacles each include a bore, such as bore 72 in support receptacle 64. Three cylindrical aluminum supports 74, 76 and 78 are secured within the support receptacles 64, 66 and 68, respectively. As shown in FIG. 1, the support 74 extends through the bore 72 in support receptacle 64 and includes a central extension 84 which passes through washer 86 into a hollow in base 14, and is headed over into header 88 to be secured in place within the support receptacle 64. The upper end 90 of cylindrical support 74 includes a centrally threaded bore 92.

Positioned on the supports 74, 76 and 78 is transverse support member 96. The transverse support member 96 includes a radially extending tab 100 which extends through an aperture in the output circuit board 58 to position and support the output circuit board as described in more detail in the aforesaid U.S. Pat. application Ser. No. 07/412,351, filed 9/25/89. The transverse support member 96 also supports the transformers such as 100 and 102 within openings and depressions as better shown by, and discussed below in connection with, FIGS. 9 and 10. Transformers 100 and 102 are positioned between the transverse support member 96 and the voltage module circuit board 110. Depending from the voltage module circuit board 110 are three electrolytic capacitors 114, 116 and 118. The electronic circuitry and operation of the voltage module 112 is described in more detail in U.S. Pat. application, Ser. No. 07/412,359, filed 9/25/89 by Warren R. Germer, assigned to the same assignee as the present invention, and hereby incorporated by reference.

FIG. 2 is a top view showing the layout of the meter-register assembly module 60, and which includes a readout window 122 in bezel 124. A slot 126 through the nameplate 128 provides access to an integral test mode actuator and indicator described in detail in copending U.S. Pat. application, Ser. No. 07/411,940, filed 9/25/89, by W. R. Germer, E. F. Coryea, A. A. Keturakis, D. H. Masery, and T. H. Stevens, and assigned to the same assignee as the present inventions. A plurality of axially depressible switches 132, 134, and 136 are provided at the top of the meter-register to enable selective actuation of a plurality of control functions, such as monthly reset, register display and self check. Flexibility as to which of these controls can be actuated from outside the transparent housing by the meter reader through a rotatable and depressible switch actuator is described in detail in U.S. patent application, Ser. No. 07/411,963, issued 9/25/90 as U.S. Pat. No. 4,959,607, filed by P. R. Coryea and W. R. Germer, assigned to the same assignee as the present invention, and hereby incorporated by reference. That patent application describes switch restrictors which may be selectively applied to one or more of the switches 132, 134, and 136 to restrict operation from outside of the transparent housing 156 of the energy meter 10, and thus effectively restrict what may be actuated by the meter reader who does not remove the meter cover, as contrasted with the serviceman or repairman who has the ability to, and may, remove the cover. The ability of the customer to selectively and readily change which of these switches are to be accessible to the meter reader, and which to the serviceman, furthers the purpose of the present invention to provide maximum flexibility within a standardized but modular energy meter configuration.

As shown in FIG. 2, the nameplate 128 is held in place by plastic nameplate snaps 129, molded as part of the bezel 124, and screws 131 which also ground the nameplate. Also, as shown in FIGS. 2 and 3, an electromagnetic (EMI) and thermal shield 138 extends from the register 60 to the base 14. The shield includes a plurality of spring fasteners 144, 146 and 148 spaced about the central region of the EMI and thermal shield which grip contact portions or extensions 150 of the transverse support member 96. The EMI and thermal shield 138 also includes a cutout 152 which is generally rectangular in shape and which provides optical visibility through the EMI and thermal shield to the bar coded nameplate and retainer member 142 positioned on the voltage module 112. The EMI and thermal shield 138 is tapered to fit snugly around the register module 60 and extend to the base 14 to fit snugly around the circular step 26 and seat on the narrow tread 28 shown in FIG. 1. The EMI and thermal shield 138 thus mechanically interconnects and provides added strength to the modular assembly comprising the base module 12, the voltage module 112, and the register module 60, in addition to providing thermal protection, EMI protection and also aesthetically obscuring the electronics within the meter from view from outside the transparent case 156. In addition, when the case 156 is removed, the shield which is grounded through transverse support member 96 provides a safety barrier against the serviceman or repairman accidentally touching the voltages within the circuitry positioned within the EMI and thermal shield 138. The details of construction of the EMI and thermal shield 138, and its use within an electronic energy meter is described in more detail in U.S. Pat. application Ser. No. 07/412,353, filed 9/25/89 by A. Palmer, M. Boutin, and P. F. Coryea assigned to the same assignee as the present invention, and hereby incorporated by reference.

As best shown in FIGS. 1 and 4, the current sensors 40, 42 and 44 are connected by multi-conductor cables 160, 162, and 164, respectively to connectors 170, 172, and 174 respectively, which connect the current or base module 12 to the meter-register assembly module 60. The connectors 170, 172 and 174 enable the current module 12 to be selectively connected to different meter-register assemblies 60, thus providing still additional flexibility in the assembly of an electronic energy meter having all of the required characteristics. It is to be noted that the multiconductor cables 160, 162 and 164 pass through an opening in the transverse support member 96 and the voltage module 112 behind the selectively removable bar coded nameplate and retainer member 142. The bar coded nameplate and retainer member 142 includes a pair of tabs 176 and 178 at the top which extend through openings in the voltage module circuit board 110, and are retained at the bottom by the spring fingers 180 and 182 which include a detent which resiliently retains the bar coded nameplate and retainer member. The bar coded nameplate and retainer member 142 is positioned in place after the multi-conductor cables 160, 162 and 164 are placed in position extending beyond the circuit board 110. The function of the multi-conductor cables 160, 162 and 164 can be further understand by reference to FIGS. 1 and 5, and, in particular to FIG. 1 which shows the cables connected through connectors 170, 172, and 174, respectively, to the meter-register module 60.

Proper angular positioning of EMI and thermal shield 138 is provided to ensure, among other things, that the cutout 152 is in alignment with the bar coded nameplate and retainer member 142 to provide optical visibility of the bar coded nameplate. The angular positioning of EMI and thermal shield 138 on the electronic meter 2 is facilitated by the guide 161 (see FIG. 2) which extends upward from step 26 (see FIG. 1) and which is molded as part of base 14. A rectangular cutout 163 which is approximately twice the width, and approximately the same height, as guide 161 in the bottom edge of the EMI and thermal shield 138 passes around the guide to provide the proper angular positioning The EMI and thermal shield 138 is positioned and rotated about the guide 161 with the assembled position of the EMI and thermal shield relative to the guide shown in FIG. 3. FIG. 9, shows the aluminum transverse support member 96. In the assembled position, the teeth of spring fasteners 144, 146, and 148 grip the circumferential area of the transverse support member 96.

Since the width of the cutout 163 is approximately twice that of the guide 161, it provides positive stops for rotation of the EMI and thermal shield 138, first on one side 191 for the assembled position shown in FIG. 3, and then on the other side 193 when the side 195 of the cutout 163 of the EMI and thermal shield 138 is rotated in the counterclockwise direction to disengage the spring fasteners 144, 146 and 148 in preparation for removing the EMI and thermal shield. Assembly of the EMI and thermal shield 138 is accomplished by sliding the EMI and thermal shield down over the meter-register assembly 60 and voltage module 112 to base 14 with the side 195 of cutout 163 adjacent the side 193 of guide 161. After the EMI and thermal shield 138 is seated in the circular step 26, it is rotated clockwise so that the fasteners 144, 146 and 148 are slid into frictional gripping engagement with the bottom and top of the transverse support member as described in detail in the aforesaid U.S. Pat. application, Ser. No. 07/412,353. At the same time, the cutout 152 is rotated into alignment with the bar coded nameplate and retainer members 142 to provide optical visibility of the bar coded nameplate.

The close fit between the EMI and thermal shield 138 and the planer transverse support member 96 provides strength and rigidity to the EMI and thermal shield and helps prevent denting of the relatively thin EMI and thermal shield when the energy meter 10 is handled or serviced with the cover 156 removed. The steel EMI and thermal shield 138 thus provides electromagnetic shielding by grounding through transverse support member 96, provides support and strength to the electronic energy meter 10, is thermally reflective, aesthetically covers and obscures the interior of the energy meter even with a transparent cover 156, and in addition provides a grounded safety shield when the cover is removed by a serviceman, preventing the fingers of the serviceman from contacting the voltages present at many places within the electronic energy meter 10.

The meter-register assembly module 60 is spaced from, and supported on, a transverse support member 96 through resilient upper support posts 184, 186, and 188, respectively. The upper support post 184, 186 and 188, as shown in FIG. 4 includes at the lower end a shoulder 190 which fits within a matching opening in the transverse support member 96 and a smaller diameter threaded rod 192 which is threaded into the centrally threaded bore 92 within the cylindrical support 74. Thus, the support post 184 is inserted through the transverse support member 96 and threaded into the support 74 to secure the voltage module 112 in place, while at the same time providing detachable support for the meter-register 60 as described below. The upper support posts 184, 186 and 188 include a resilient U-shaped upper end (best shown in FIG. 4) including inwardly tapering edges 196 and 198 and annular groove 200, which provides a resilient, selectively detachable, support for mating sockets in the bottom of the bezel 124 of the register module 60 as described below in connection with FIG. 8. The support posts 184, 186 and 188 may be fabricated of aluminum, or a molded plastic. If plastic support posts are used, the ground connection from the voltage module to the register module 62 may be made through ribbon cable 324.

FIG. 4 also illustrates the interconnection of the current sensors 40, 42 and 44 to the terminals in the meter base. Referring to FIG. 4, it is to be noted that current sensor 42 is directly supported on and connected to terminal 206 and is connected to terminal 208 by the angularly extending bar 210 such that current flow in a power line under measurement passes through the current sensor 42 by way of terminals 206 and 208. The base module 12 may be either self-contained, or transformer rated, to match the particular basic form of the energy meter according to the application description of ANSI standard C12.10 and establish the desired class or current rating. A central row of terminals such as 214 are auxiliary terminals, and in transformer rated meters provide auxiliary access to the energy meter 10 such as for the potential connections. In some transformer rated versions of the ANSI standard S-based meter, the pulse initiator KYZ connections may be made through spare ones of these auxiliary terminals, such as 214 shown in FIG. 4. There may be as many as seven auxiliary terminals in a row through the central region of the meter base, and three of these auxiliary terminals may be used to provide the KYZ connections. In order to be able to selectively couple the KYZ terminals to the electronic energy meter 10, they are wired via conductors 220, 222, and 224 which detachably mate with pins 230, 232 and 234 of the edge connector 236 included on the output circuit board 58 (see FIG. 6).

FIG. 6 also shows the connection of one of a family of output circuit boards 58 which provide selectively attachable (and detachable) signal interconnection and conditioning between a connector 59 on the register module 60 and the outside of the electronic energy meter 10 (see FIG. 1) as described in detail in copending U.S. Pat. application, Ser. No. 07/412,351 filed by W. R. Germer, J. Stillwagon and P. F. Coryea, and assigned to the same assignee as the present invention, and which is hereby incorporated by reference. The output circuit board includes a plurality of connector pins 238 which extend through the base 14 of electronic energy meter 10 to a re-entrant pocket 243 in the base. Connections may be made to the connector pins through a plug connector 240 which is inserted into the re-entrant pocket 243 and which then connects the register module 60 with the outside of the energy meter through cable 244. A pivoted resilient latch 216 on the plug connector includes a projection 245 which extends into an aperture in the wall of the cavity 54 when the plug connector is positioned in the re-entrant pocket 243. The plug connector 240 may be disconnected by pressing against the bottom of latch 216 to move the projection 245 out of the aperture, and pulling the plug connector downward out of contact with connector pins 238.

The specific electronics included on the output printed board 50 will depend on the specific functions and modes of operation desired, or required, by the customer, and by the specific installation. There are many potential options such as the provision of a signal to indicate the end of the demand interval, a demand threshold alert, pulse initiation, and various indicating and built-in test functions. However, with only 6 or 8 output circuit boards wide flexibility and versatility may be realized in meeting substantially all of the common signal requirements. Thus, the basic energy meter may be built and stocked with late point identification of specific features for a specific meter, including later selecting or changing the output circuit board to meet new or different customer requirements and features. Removal, and insertion of the same, or a different, output circuit board is simple and quickly accomplished. This also simplifies repair and maintenance of the boards, and of the energy meter.

The output circuit board 58 may also include a VAR-Q switch, shown as a sliding switch 246 in FIG. 6. Alternatively, a jumper arrangement could be provided to hard wire in the VAR or Q hour operation. That is, the family of output circuit boards 58 which may be selectively connected to provide signal connection and conditioning between the meter-register module 60 and the outside of the electronic energy meter 10 may be provided with even increased flexibility through switch 246 to enable selective operation to provide VARS or Q hour output. A description of the circuitry for use in VAR-Q switching is described in copending U.S. Pat. application Ser. No. 07/412,359 filed 9/25/89 by B. White, M. Negabahn, M. J. Ouellette, and W. R. Germer, and assigned to the same assignee as the present invention.

FIG. 7 is a top view of one base 14 used in a transformer rated meter and showing the connection of the KYZ connector 226 through leads 220, 222 and 224 to the internal portions of the auxiliary terminals 250, 252, 254, respectively. In addition, a plurality of individual connections are made to the various other auxiliary terminals, with each of the individual connections including a lead terminating in a resilient socket connector. In the particular arrangement shown in FIG. 7, which is an ANSI standard form 9S meter, lead 260 is connected between the female socket connector 270 and the auxiliary terminal 261, lead 262 is connected between the socket connector 272 and auxiliary terminal 267, lead 264 is connected between socket terminal 274 and auxiliary terminal 267, lead 266 is connected between socket terminal 276 and auxiliary terminal 267, lead 268 is connected between socket terminal 278 and auxiliary terminal 265, and lead 269 is connected between socket terminal 279 and auxiliary terminal 263. That is, there is a lead and connector to each of the four auxiliary terminals which do not include the KYZ connector, and terminal 267 includes two additional leads and connectors.

The various base or current modules 12 provide the energy meter 10 with the capability to be completely interchangeable with, and thus replace, existing and installed energy meters, and which may, for example, utilize the KYZ terminals in the meter base. That is, form, fit, and function of the meters are made interchangeable, even though the electronic energy meter 10 has greatly expanded capabilities and functions such as built-in test and other functions described above.

Leads 260, 262, 264, 266, 268, and 269 provide voltages to the voltage module 112 to power the voltage module and circuitry in energy meter 10, and for the measurement of those voltages, and are connected to their respective male connectors through socket terminals 270, 272, 274, 276, 278, and 279 which pass through openings or slots in the transverse support member 96. As shown in FIG. 5, opening 284 is provided in support member 96 below terminals 286 and 288 which extend downward or depend from the voltage module circuit board 110. Terminals 292 and 296 extend downward from the voltage module circuit board 110 through opening 292 in the transverse support member 96, terminal 302 extends downward from voltage module circuit board 110 through the slot 300 in the support member, and terminal 306 similarly extends downward from the voltage module circuit board through the slot 304 in the transverse support member.

As shown in FIG. 5, the upper surface of the voltage module circuit board 110 includes indicia of the color of the lead to be connected to the terminal which extends below the indicia. Adjacent terminal 286 is the indicia 287 "GRN," adjacent terminal 288 is the indicia 289 "BLU," adjacent terminal 294 is the indicia 295 "WHT," adjacent terminal 296 is the indicia 297 "YEL," adjacent terminal 302 is the indicia 303 "ORG," and adjacent terminal 306 is the indicia 307 "RED." These indicia indicate the color of the lead to be connected to the connector under the circuit board 110 at that point, which colors are respectively, green, blue, white, yellow, orange, and red. The indicia 287, 289, 295, 297, 303 and 307 are formed by deposition on the surface on the voltage module circuit board 110 at the same time that the conductors or runs are deposited on the circuit board. Leads 260, 262, 264, 266, 268 and 269 are similarly color coded to minimize the possibility of incorrect connections between the base module 12 from the auxiliary terminals 261, 263, 265, and 267 to the voltage module 112. The same color coding is used for the family of base modules 12 which conform to the ANSI standard such that the same color coded voltage module 112 may be used with the various base modules even though particular base modules may have fewer leads than 260, 262, 264, 266, 268 and 269.

It is to be noted that the top surface of the voltage module circuit board 110 includes bar code indicia 308 and as shown in FIG. 4 the voltage module 112 also includes a bar code 310 on the bar coded nameplate and retainer member 142. These bar codes are readable by an optical scanner during the manufacture or repair of the meter to accurately identify the particular configuration of module components which have been connected in order that the automatic test equipment will perform the proper test for that particular configuration. The cutout 152 in the EMI and thermal shield 138 (see FIG. 3) is positioned adjacent the bar code 310 on the member 142 when the meter is assembled such that the proper test procedures can be applied to the particular meter by optically scanning the bar code through the EMI and thermal shield through the transparent cover 138, without removing the cover at the time of test. This bar coding identifies the basic meter 101, that is the meter 10 less the register module 60, as shown in FIG. 4, and identifies and enables proper testing of various connections and voltage ratings. The various other modules of electronic energy meter 10 also include bar coding which is positioned to be visible to be both machine readable and human readable. The bar coding 308 for the voltage module 112 which is provided on the top of voltage module circuit board 110 (see FIG. 5) identifies the voltage rating and number of transformers included in the particular voltage module. The plastic shield 103 over output circuit board 58 (see FIG. 1) includes other bar coding which identifies various functions resident on the particular output circuit board. Similarly the register module 60 includes bar coding on the top of bezel 124 (see FIG. 8) to identify the register and its functions. Bar coding may also be placed on the nameplate 128 (see FIG. 8) to identify the completed electronic energy meter 10 and its functions resulting from the flexible selection of the various modules. Thus, it is to appreciated that considerable attention has been provided in the design of the electronic energy meter 10 to prevent errors in the interconnection of the various modular and versatile assemblies which flexibly provide the various functions and modes of operation required by the customer.

Still further versatility is provided by the jumpers 314, 316, 318, and 320, (best shown in FIG. 5) which are connected in the circuitry of the voltage module circuit board 110 across notches 315, 317, 319, and 321, respectively. The desired combination of jumpers are cut during assembly to form a digital word describing the required multiplication for the particular meter to meet the required form. A form of a meter is an application description according to ANSI standard C12.10 which includes the definition for each circuit application, that is how the voltages and currents are to be multiplied together to produce the required watts output. In an analog electro-mechanical energy meter, this function is hard wired into the energy meter, requiring the provision of different models for different circuit applications. In the digital electronic meter 10 of the present invention, the multiplication of the digital representation of the input signals can be controlled to conform to the application as required through the software involved. The placement of the jumpers 314, 316, 318 and 320 on the voltage module 112 enables the jumpers to be cut to tailor the basic meter (that shown in FIG. 4) in light of a specific configuration of current sensors present in the selected current module 12 and voltage module 112 to normalize and provide standard signals from the basic meter. One jumper describes and/or selects the proper signal processing depending on whether the basic meter is self contained or transformer rated while the remaining jumpers define the particular meter type. Accordingly, the jumpers 314, 316, 318 and 320 are provided in the circuit board 110 in order to provide increased flexibility by enabling selective cutting of the appropriate wire jumpers during assembly to form the appropriate digital word to describe the required multiplications which will match the required form. That digital word becomes an additional input supplied by the voltage module 112 to the register module 60. Providing normalized standard signals from the basic meter, which is customized from the point of view of current and voltage ratings and configurations, and which describes a particular ANSI meter form, enables the selective use of universal meter-registers which are suitable for use with the various customized basic meters 101. Registers suitable for use with any of the customized basic meters may include demand registers, various time of use registers, KVA registers, and recording demand registers. These various types of registers with various ranges may be manufactured and stocked as modules. The selected meter-register module may then be readily attached to the customized basic meter to further customize the completed energy meter, adding a further element of flexibility in accordance with the present invention.

In addition, the register and meter functions are thus combined in the meter-register assembly module 60 so that the basic modules are reduced to only 3, the base or current module 12, the voltage module 112, and the register assembly or module 60. These are readily and selectively interconnected mechanically and electrically/electronically as described in connection with the present invention.

Connections from the voltage module 112 to the register module 60 is provided by the multi-connector ribbon cable 324 shown in FIGS. 1 and 5. Referring to FIGS. 1 and 5, the conductors such as 326 extend through the voltage module circuit board 110 and are connected in circuit with leads and/or components on both sides of the circuit board, which are connected through the ribbon cable 324 to connector 328 which is used to connect a basic meter 101 comprising the base module 12 and the voltage module 112 to the selected register assembly module 60. As a result, the modular construction of the present invention enables and facilitates the interchangeability of the three layers or modules of the electronic energy meter 10 through the use of detachable connectors and supports between the current module and voltage module, between the voltage module and the register module, and between the base module and the register module. This provides greatly expanded capabilities to select, interconnect, assemble, customize and test the electronic energy meter with a minimum effort and chance of error, even with the large number of combinations and features and modes of operation provided. The interchangeable electrical and mechanical interconnection arrangement of the present invention minimizes the time and expense of assembly, and also minimizes the potential of interconnection error.

Base module 12 also includes a ground connection to the electronic circuitry of the energy meter Referring to FIG. 7, a ground lead 330 is provided with a spade lug 332 at its free end, and a spade lug 334 at its inner end. The spade lug 334 is riveted through the base 14 to a spring clip (not shown) underneath the meter and grounds to the base of the meter socket (not shown) when the meter is inserted in its socket. The free end of the ground lead 330 is connected through spade lug 332 to ground the transverse support member 96 of the voltage module 112 by positioning the spade lug between the aluminum support 74 and the resilient support post 184, thus providing a detachable ground connection between the outside of the energy meter 10 and the electronics of the energy meter.

The details of construction of the voltage module 10 are best shown in FIGS. 9 and 10. Referring to FIGS. 9 and 10, it is to be noted that the transformers 101, 102, 104, and 106 are positioned within openings such as 338 and 340 within the transverse support member 96 with their cores 342 and 344, respectively, abutting the transverse support member 96 as best shown in FIG. 9, and their coils 346 and 348, respectively, extending both above and below the transverse support member. The transformers are held in place, with bifurcated clamps 352 and 354 positioned to overlap the cores of transformers 104, 106 and 101, 102, respectively. The opposite corner of transformer 104 is secured by clamp segment 356, the opposite corner of transformer 102 is secured by clamp segment 358, the opposite corner of transformer 101 is secured by clamp segment 362, and the opposite corner of transformer 106 is secured by clamp segment 360. Clamp segments 356, 358, and 360, 362 are also formed as a pair of bifurcated clamps. Thus, diagonally opposite corners of each transformer are secured in place by clamps which extend from the transverse support member 96 to the bottom of each transformer, securing the transformer between the transverse member and the clamp. Coils 346 and 348 of transformers 102 and 104, respectively, are positioned on either side of the cores 342 and 344, respectively, with a portion of each coil positioned between the transverse support member 96 and the voltage module circuit board 110. Each of the four clamps namely bifurcated clamp 352; bifurcated clamp 354; clamps 356, 358; and clamps 360, 362 are secured to a spacer post such as 366, 368, and 370 (shown in FIG 10) which are positioned between, and secure, the transverse support member 96 and the voltage module printed circuit board 110. The spacer posts, such as 366, include a threaded base to receive screw 378 and a threaded central extension 376 having a smaller diameter than the post extends through the voltage module circuit board 110, and is secured by nut 380. An annular rim 382 on the spacer 366 adjacent the transverse support member 96, and the shoulder 384 formed by the reduced diameter step of the threaded extension 376 maintains the spacing and distance between the transverse support member and the circuit board 110. As a result, the transformers 100, 102, 104, and 106 may be selectively positioned and retained within the voltage module 112, and their voltage characteristics and ratings are selected to meet the particular customer requirements. There may be two or three voltage sensing transformers as required by the ANSI standard C12.10 form description. The fourth transformer such as that shown in FIGS. 8 and 9 comprises the power transformer of a built-in power supply circuit, the electronic components of which are attached to the voltage module circuit board 110. The voltage ratings of the transformer primary windings establish the voltage of the module, and also that of the electronic energy meter 10. The selected voltage module 112 and current sensors 40, 42 and 44 reduce and normalize the voltage and current inputs to the energy meter 10 to a level suitable for direct application of the electronic circuits to the energy meter. As pointed out above, an objective of the electronic energy meter 10 is to provide a standard modular energy meter configuration with maximum built in flexibility to meet customer requirements and specifications.

A meter-register module 60 suitable for use with the flexible basic meter assembly 101 shown in FIG. 4 having defined functions such as Maximum Demand, Time of Use and other functions is selectively connected to the basic meter. The electrical connections to the meter-register module 60 have been described above, and are provided through attachable (and detachable) connectors which connect the register module to the voltage module 112, and also to the base or current module 12. Mechanical support upon, and spacing from, the voltage module 112 is provided by the support posts 184, 186, and 188. The inwardly tapering edges 196 and 198 at the ends of the support posts, and annual grove 200 (best shown in FIG. 4) mate with apertures in the register module 60.

Referring next to FIG. 8, the bezel 124 of the register module 60 is spaced from the meter-register circuit board 386 by the rim 388 of the bezel 124, and secured in place by a plurality of resilient fasteners such as 392 and 394. Fasteners 392 and 394 are molded integral with the bezel 124 and include extensions such as 398 and 400 with tapered and rounded end jaws 402 and 404 connected to the extensions by a step or ridge 406. When the register circuit board 386 is pressed down around the resilient fasteners, such as 392 and 394, the tapered jaws 402 and 404 are forced toward one another until they pass through the apertures in the register circuit board, after which they spring outwardly with the ridge 406 positioned securely about the aperture, and against the bottom of the register circuit board.

Three apertures, such as 410 shown in FIG. 8, are provided in appropriate positions to cooperate with the upper support posts 184, 186, and 188 (see FIG. 4), and are dimensioned to securely fit around the annular grove 200 in the resilient support post. In securing the appropriate meter-register module 60 to the basic meter 101, that is the register appropriate for the meter as configured to meet the customer requirements and late feature identification described above, the register module is positioned over the upper support post 184, 186, and 188 as shown in FIG. 4 such that the apertures 410 contact the inwardly tapering edges such as 196 and 198. Downward pressure on the register module 60 forces the open jaws formed by the tapering edges toward one another until the aperture 410 is pressed into the region of the annular grove 200, at which point the resiliency of the compressed tapered jaws causes the jaws to spring outward, firmly seating the annular grove 200 around the rim of the aperture 410 on either side of the register circuit board 386. The connectors 170, 172, 174, and 324 are then attached to connect the register module 60 in circuit with the basic meter assembly.

Thus, the present invention incorporates a flexible modular construction in which each of the modules are provided with a basic versatile structure which is readily customized in those areas where variable functions and modes of operation require customization. Detachable components and connectors shorten the time and effort required to customize the meter, while at the same time minimizing chances of error. The electronic energy meter 10 is readily adaptable to mass production of basic components which are then selectively combined to meet substantially all foreseeable customer requirements with a minimum of parts and maximum flexibility. This allows the manufacture and stocking of basic modules and components, with late point feature identification which can be readily incorporated to customize the basic meter to meet the differing customer specifications and requirements. This simplified and less costly electronic energy meter is efficient not only in manufacture, but also in the stocking of spare parts and in the repair and maintenance of the meter.

Thus, while the present invention has been described through preferred embodiments, such embodiments are provided by way of example only. Numerous variations, changes and substitutions, including those discussed above will occur to those skilled in the art without departing from the scope of the present invention and the following claims.

What we claim is:

1. A modular flexible electronic energy meter enabling manufacture of basic components with the late point identification of features and functions, and with built in provisions to later customize the power meter to incorporate such features and functions comprising:
   a current module selected from a plurality of current modules of various ratings including a base with terminals extending through said base from outside said power meter and connecting said electronic power meter in circuit with a source of power and a load to be metered;
   said current module including means to secure and connect one or more current sensors to the interior of said current module to provide the desired current capability class;
   a voltage module selected from a plurality of voltage modules of various ratings and including a substantially planar support member substantially parallel to said base and a means to secure and connect one or more selected transformers;
   said voltage module being detachably supported on said current module; and
   a meter-register assembly selected from a family of meter and meter-register assemblies of various functions being detachably supported on said voltage module;
   said meter-register assembly being provided with normalized standard signals from said current and voltage modules and being compatible with the various combinations of current and voltage modules.

2. A modular flexible electronic energy meter of claim 1 wherein flexible conductors with connectors adjacent said register assembly are provided to interconnect the circuitry of said register assembly and said voltage and current modules.

3. A modular flexible electronic energy meter of claim 2 wherein said voltage module includes a voltage circuit board with connectors to enable selectively detachable connections to the circuitry of said voltage circuit board from said current module.

4. A modular flexible electronic energy meter of claim 3 wherein at least some of the selectively detachable connectors pass through said planar support member.

5. A modular flexible electronic energy meter of claim 4 wherein at least some of said selectively detachable connections pass through openings in said support member to connect to connectors positioned on said voltage circuit board.

6. A modular flexible electronic energy meter of claim 5 wherein said voltage circuit board includes a power supply for providing power to at least some of the electronic circuitry within said power meter.

7. A modular flexible electronic energy meter of claim 6 wherein said planar support member includes openings configured to receive one or more transformers.

8. A modular flexible electronic energy meter of claim 7 wherein a transformer for said power supply is positioned within one of said openings of said planar support member.

9. A modular flexible electronic energy meter of claim 8 wherein detachable securing members are provided to secure said one or more transformers to said planar support member.

10. A modular flexible electronic energy meter of claim 9 wherein there are openings in said planar support member to receive up to four transformers.

11. A modular flexible electronic energy meter of claim 10 wherein said one or more transformers each include a core and said detachable securing members are clamps provided at the intersections of two adjacent transformers.

12. A modular flexible electronic energy meter of claim 11 wherein a plurality of spacers are provided between said planar support member and said voltage circuit board, and each of said clamps are secured to said planar support member by fasteners which pass through said planar support member into a threaded bore in one of said spacers.

13. A modular flexible electronic energy meter of claim 12 wherein said spacers include a threaded central extension which extends through said voltage circuit board and is secured thereto by an internally threaded member on the opposite side of said voltage circuit board.

14. A modular flexible electronic energy meter of claim 13 wherein said voltage circuit board is secured between shoulders formed on said spacers around the threaded central extension and said internally threaded nut.

15. A modular flexible electronic energy meter of claim 14 wherein said transformers include coils extending substantially perpendicular to said cores, with a portion of said coil positioned between said planar support member and said voltage circuit board, and said core and the opposite portion of said coil being positioned beneath said planar support member.

16. A modular flexible electronic energy meter of claim 7 wherein said planar support member includes a dished rim around at least a substantial portion of each of said openings to receive and position a transformer.

17. A modular flexible electronic energy meter of claim 16 wherein the top of said voltage circuit board includes a bar code identifying the nature of said voltage circuit board to facilitate the identification thereof.

18. A modular flexible electronic energy meter of claim 17 wherein said voltage circuit board is connected to said register assembly through a ribbon cable, the conductors at one end of which are wired in circuit with said voltage circuit board, and the other end of which is wired to a connector positioned adjacent said register assembly.

19. A modular flexible electronic energy meter of claim 4 wherein the detachable connectors which connect said current module to said register assembly pass through openings in the periphery of said planar member and the periphery of said voltage circuit board and are retained in position by a planar retainer detachably positioned between said planar support member and said voltage circuit board.

20. A modular flexible electronic energy meter of claim 19 wherein said openings in the periphery of said planar support and voltage circuit board are edge slots.

21. A modular flexible electronic energy meter of claim 20 wherein said retainer includes one or more extensions from one edge which pass through openings through said voltage circuit board, and said planar support includes one or more resilient fingers which support and position the edge opposite said one edge of said retainer member.

22. A modular flexible electronic energy meter of claim 21 wherein said retainer member has a retainer bar code identification identifying the nature of said electronic energy meter to facilitate the identification and proper testing procedure thereof.

23. A modular flexible electronic energy meter of claim 22 wherein said printed circuit board includes one or more capacitors which extend downward through openings in said voltage circuit board.

24. A modular flexible electronic energy meter of claim 23 wherein said electronic energy meter includes an electromagnetic interference and thermal shield surrounding said voltage module and extending from said register assembly to said base, and said electromagnetic interference and thermal shield includes an aperture to enable said retainer bar code to be visible from outside said electromagnetic interference and thermal shield.

25. A modular flexible electronic energy meter of claim 24 wherein said electronic energy meter includes a transparent housing extending from said base and surrounding said voltage module and said register assembly with said retainer bar code being visible from outside said meter.

26. A modular flexible electronic energy meter of claim 3 wherein said base includes a plurality of hollow supports extending upward and integral therewith.

27. A modular flexible electronic energy meter of claim 26 wherein a second support is positioned in each of said hollow supports and secured to said base, said second supports extending to said planar support member to detachably support said voltage module above said current module.

28. A modular flexible electronic energy meter of claim 27 wherein each of said second supports includes a threaded bore at the end adjacent said planar support member, and said planar support member includes holes over each said threaded bore through which a fastener, having a threaded central portion, passes to secure said planar support member to said second supports.

29. A modular flexible electronic energy meter of claim 28 wherein said fastener is at the first end of third supports which extend between said voltage module and said meter-register assembly.

30. A modular flexible electronic energy meter of claim 29 wherein said third supports are detachable, and include resilient fingers having tapered edges at their other end, and an annular groove around the periphery of said third supports below said tapered edges, said taper extending inwardly toward the other end of said third supports remote from said voltage module.

31. A modular flexible electronic energy meter of claim 30 wherein said register includes a plurality of apertures in the bottom thereof positioned to mate with said resilient fingers of said third supports when said register is pressed over said third supports such that said tapered edges press said fingers toward one another until the apertures pass said fingers to be retained in said annular groove with the tapered edges overlying the top of said groove.

32. A modular flexible electronic energy meter of claim 31 wherein said register assembly includes a register circuit board at the bottom thereof, and said apertures are in said register circuit board.

33. A modular flexible electronic energy meter of claim 32 wherein said register circuit board includes the electronic circuitry for both the meter and register functions.

34. A modular flexible electronic energy meter of claim 33 wherein said register assembly includes a bezel having a plurality of resilient fasteners extending downward to support and position said register circuit board below said bezel.

35. A modular flexible electronic energy meter of claim 34 wherein said resilient fasteners have tapered segments at the ends adjacent said register circuit board, and an annular groove around the periphery of said resilient fasteners above said tapered segments, said taper extending inwardly toward the bottom of said resilient fasteners remote from said bezel.

36. A modular flexible electronic energy meter of claim 35 wherein said register circuit board includes a plurality of apertures positioned to mate with said resilient fasteners of said bezel when said register circuit board is pressed over said tapered segments which presses the tapered segments toward one another until the apertures pass over said tapered segments to surround and be retained by said annular groove with the tapered segments overlying the bottom of said groove.

37. A modular flexible electronic energy meter of claim 4 wherein said base includes a circular step, and a removable electromagnetic and thermal heat shield surrounds said voltage module and extends from said circular step to the circumference of said register assembly, said electromagnetic and thermal shield including fasteners to secure the shield to said substantially planar support member and provide rigidity and strength to said electronic energy meter.

38. A modular flexible electronic energy meter of claim 37 wherein said electronic energy meter includes a selectively detachable output circuit board to provide desired signal connection and conditioning between the outside of said electronic energy meter and said register assembly, said output circuit board including a connector at the top and bottom thereof, the bottom, connector of which passes through said base and the top connector of which mates with a connector in said register assembly, such that said output circuit board may be selectively connected in circuit with said register assembly.

39. A modular flexible electronic energy meter of claim 38 wherein said output circuit board is surrounded closely by an electromagnetic and thermal shield which retains said output circuit board in position with said top connector in contact with the connector in said register assembly.

40. A modular flexible electronic energy meter of claim 3 wherein said voltage circuit board includes four notches at the periphery thereof across each of which a jumper is positioned and connected in circuit with conductors on either side of said jumper, such that one or more of said four jumpers may be cut to flexibly convert said electronic energy meter to a different form for the multiplication of currents sensed by said current module and voltages sensed by said voltage module.

41. A modular flexible electronic energy meter of claim 34 wherein said register circuit board includes a plurality of edge connectors, the pins of which extend substantially parallel to said register circuit board.

42. A modular flexible electronic energy meter of claim 41 wherein said edge connectors on said register circuit board are positioned within apertures in the bezel of said register assembly.

43. A modular flexible electronic energy meter of claim 42 wherein said electronic energy meter includes a transparent housing, said meter-register assembly includes a plurality of axially depressible shafts for push button switches positioned on the top thereof below said transparent housing, an actuator extends through said transparent housing and is positionable to depress a selected one of said switches, and one or more switch restrictors selectively and detachably positioned about one or more of said switches to preclude actuation by said actuator enabling selection of which switches can be actuated from outside said housing.

44. A modular flexible electronic energy meter of claim 43 wherein said one or more switches having their actuation from outside said housing restricted by said one or more switch restrictors may be actuated by manually depressing said one or more switches when said housing is removed, whereby said restrictors selectively enable a separation of those meter functions which may be actuated by a person having access to said actuator from outside said electronic energy meter, and those meter functions which may be actuated by a person having access to the inside of said electronic energy meter.

45. A modular flexible electronic energy meter of claim 44 wherein said actuator includes a locking arrangement to control and limit the access to the operation of said actuator.

46. A modular flexible electronic energy meter of claim 45 wherein each of said switch restrictors comprise a removable sleeve having an interference fit in a groove around a shaft in said bezel of said register assembly and which surround only an arcuate portion of the circumference of said shaft enabling the depressing of such shafts in the arcuate portion which is not surrounded by said switch restrictor.

47. A method of assembling a modular and flexible electronic energy meter compatible with late point identification of features to enable customizing of the power meter to later incorporate a variety of features and functions comprising the steps of:

fabricating a family of current modules by molding a base including a plurality of terminals attached to and passing through said base for connecting said electronic energy meter in circuit with a source of power and a load to be metered in accordance with industry standards, and including a plurality of vertical support members;

providing means to fasten selected current sensors to said terminals;

fabricating a family of voltage modules including a planar support member and further including means for receiving one or more selected transformers by said support member, and providing connecting means on said planar support member which substantially correspond in position to said vertical support members;

fabricating a family of meter and meter-register assembly modules including a register face on the top surface thereof and providing spaced connecting means thereon;

stocking said modules;

subsequently customizing one or more of said modules by selectively performing the following steps on the selected one or more of said modules;

connecting one or more selected current sensors of the desired ratings to said current module to selected one or more of said terminals, and connecting electrical leads from said current sensors to one or more current module connectors spaced from said current sensors an adequate distance to reach said meter-register module when said modules are assembled;

providing a voltage circuit board for said voltage module and positioning one or more selected transformers of desired ratings on said planar support member and connecting said transformers in circuit with said voltage circuit board; and connecting multiple electrical leads from said voltage circuit board to one or more voltage module connectors spaced from said voltage circuit board an adequate distance to reach said register module when said modules are assembled;

spacing a meter-register assembly circuit board from the face of said register assembly module and fabricating electronic circuitry thereon which in combination with said register assembly circuit board provides selected meter functions; and connecting a plurality of connectors to said meter-register assembly circuit board configured to mate with said one or more current module connectors and with said one or more voltage module connectors; and subsequently assembly said voltage module to said current module through said vertical support members to secure said voltage module in spaced relation substantially parallel to said current module; and securing said meter-register assembly module to said voltage module through detachable spacers between said planar support member and said register assembly module; and connecting said current module connectors and said voltage module connectors to said plurality of connectors in said register assembly module.

48. The method of fabricating and subsequently customizing an electronic energy meter of claim 47 with the additional step of connecting detachable leads from said current module to said voltage module through connectors at the end of said detachable leads and connectors provided on said voltage circuit board.

49. The method of fabricating and subsequently customizing an electronic energy meter of claim 48 including the additional step of aligning the connecting means of said register module to substantially correspond in position to said vertical support members of said current module.

50. The method of fabricating and subsequently customizing an electronic energy meter of claim 49 wherein said register assembly module is assembled to said voltage module by aligning said spaced connecting means on said register module with said vertical support members of said current module, providing apertures in said planar support member of said voltage module aligned with said vertical support members, and detachably attaching said current module by passing threaded ends of said detachable spacers through said apertures in said planar support member to connect to said vertical support members and secure said planar support member between said vertical support members and said detachable spacers.

51. The method of fabricating and subsequently customizing an electronic energy meter of claim 50 wherein a voltage circuit board is provided for said voltage module, and a power supply circuit for electronic circuitry for said electronic energy meter is carried by said voltage circuit board, and energization for said power supply is provided through one or more of said detachable leads from said current module to said voltage module.

52. The method of fabricating and subsequently customizing an electronic energy meter of claim 51 wherein capacitors are connected to said voltage circuit board and extended through apertures in said planar support member.

53. The method of fabricating and subsequently customizing an electronic energy meter of claim 52 wherein said power supply is configured to provide the power ratings required by the selected register assembly module.

54. The method of fabricating and subsequently customizing an electronic energy meter of claim 50 wherein a connector receptacle including a plurality of spaced holes is molded in said base, an edge connector is fastened to the register circuit board, an output circuit board is selected to provide the desired signal connections and signal processing, and said output circuit board is positioned and connected between said base and said current module and said register circuit board 55. The method of fabricating and subsequently customizing an electronic energy meter of claim 54 wherein said selected output circuit board is detachably connected by positioning the connector on the bottom of said output circuit board in position with said connector receptacle in said base and rotating the top of said output circuit board about said connector receptacle until a connector at the top of said output circuit board is connected to said edge connector of said register circuit board.

56. The method of fabricating and subsequently customizing an electronic energy meter of claim 55 wherein a projection is provided on said planar support member and a mating aperture is provided in said output circuit board, and when the top of said output circuit board is rotated toward said edge connector said slot extends through said mating aperture to position said output circuit board across the periphery of said electronic energy meter.

57. The method of fabricating and subsequently customizing an electronic energy meter of claim 48 wherein an electromagnetic and thermal shield is slid down over said register assembly module and past said voltage module onto a circular step molded in said base to closely surround said register assembly module and retain said output circuit board in place.

58. The method of fabricating and subsequently customizing an electronic energy meter of claim 57 wherein said electromagnetic and thermal shield is stamped to provide a plurality of resilient spring fasteners around the central circumference thereof which grip said planar support member when said electromagnetic and thermal shield is slid into position.

59. The method of fabricating and subsequently customizing an electronic energy meter of claim 58 wherein said electromagnetic and thermal shield is fabricated from sheet ferrous material into a tapered tube with tabs extending from one axial edge under the other axial edge, and said tabs are welded in place.

60. The method of fabricating and subsequently customizing an electronic energy meter of claim 59 wherein a transparent housing is positioned over said register assembly module and slid over said voltage module and secured to said base.

61. The method of fabricating and subsequently customizing an electronic energy meter of claim 48 wherein an electromagnetic shield is positioned around said voltage module extending from said register assembly module to said base, an aperture is provided in said electromagnetic interference and thermal shield, and a bar code is positioned behind said aperture on said voltage module defining the customized voltage and current modules, and optically reading said bar code to identify ratings of said meter.

62. The method of fabricating and subsequently customizing an electronic energy meter of claim 61 wherein optically reading the bar code is used to control the testing procedures applicable to that customized combination of modules.

63. The method of fabricating and subsequently customizing an electronic energy meter of claim 61 wherein said base includes an upwardly extending angular positioning member adjacent the bottom of said electromagnetic and thermal shield, and said electromagnetic and thermal shield includes a cutout wherein said cutout is positioned about said positioning member to position said aperture in said electromagnetic and thermal shield adjacent said bar code to enable viewing of said bar code through said aperture.

64. The method of fabricating and subsequently customizing an electronic energy meter of claim 63 wherein said cutout is in the order of twice the angular length as said angular positioning member and said electromagnetic and thermal shield is rotated until one end of said cutout contacts one end of said angular positioning member to position said aperture in said electromagnetic and thermal shield adjacent said bar code to enable viewing of said bar code through said aperture.

65. The method of fabricating and subsequently customizing an electronic energy meter of claim 64 wherein said rotation of said electromagnetic and thermal shield rotates said plurality of resilient spring fasteners on said electromagnetic and thermal shield to grip said planar support member.

66. The method of fabricating and subsequently customizing an electronic energy meter of claim 64 wherein said angular positioning member is provided in said circular step.

* * * * *